United States Patent [19]

Pearlman et al.

[11] 4,011,466

[45] Mar. 8, 1977

[54] DYNAMIC FILTER

[75] Inventors: Alan R. Pearlman, Newton; Timothy C. Gillette, Brookline, both of Mass.

[73] Assignee: ARP Instruments, Inc., Newton, Mass.

[22] Filed: May 10, 1976

[21] Appl. No.: 684,788

[52] U.S. Cl. .............................. 307/229; 307/237; 328/167; 330/107

[51] Int. Cl.² .................. H03K 17/02; H03B 1/00; H03F 1/36

[58] Field of Search ..................... 307/229, 530, 7; 328/167; 330/301, 107

[56] References Cited

UNITED STATES PATENTS

| | | | |
|---|---|---|---|
| 3,805,091 | 4/1974 | Colin | 307/229 |
| 3,924,199 | 12/1975 | Pearlman | 328/167 |

Primary Examiner—Stanley D. Miller, Jr.
Assistant Examiner—B. P. Davis
Attorney, Agent, or Firm—Cesari and McKenna

[57] ABSTRACT

A low noise resonant filter of wide dynamic range and low distortion is formed from a number of series-connected filter stages, each comprising a current integrating amplifier driven from transconductance formed from a bipolar differential pair with feedback to one member of the transconductance pair to maintain its transconductance substantially constant. A further bipolar differential pair transconductance at the input stage operates with a widely variable transconductance and provides soft limiting and wide dynamic range, especially when the filter is operated in the resonant mode.

14 Claims, 2 Drawing Figures

4,011,466

DYNAMIC FILTER

BACKGROUND OF THE INVENTION

1. Field of the Invention

The invention relates to filters and, more particularly, to voltage controlled resonant-type filters used in electronic music synthesis.

2. Prior Art

Filters are commonly used in musical signal processing to controllably modify selected characteristics of a signal being filtered. Typically, the cut-off frequency of the filter is made adjustable in response to a control voltage which sets the cut-off frequency of the filter and thereby enables the generation of varying output signals from a standard input signal such as a square wave, triangular wave, etc. Such filters typically use conventional (voltage responsive) operational amplifiers connected in varying configurations such as the integrating configuration, the amplifying configuration, etc. to perform the requisite wave shaping. An especially useful filter of this type is described in U.S. Pat. No. 3,805,091, issued Apr. 16, 1974 to Dennis P. Colin and assigned to the assignee of the present invention. The present invention constitutes a further development of, and improvement over, that filter.

Resonant filters utilize controlled amounts of positive feedback within the filter to provide resonance at a selected frequency. For example, in music synthesizers, pleasing musical effects can be obtained by applying a square-wave to a filter and utilizing a controlled amount of positive feedback within the filter to provide resonance at the fundamental frequency of the wave. An example of a resonant filter is shown in U.S. Pat. No. 3,924,199 issued Dec. 2, 1975 to Alan R. Pearlman and assigned to the assignee of the present invention.

Because of the potential instability problems imposed by positive feedback, it is necessary to limit the audio input signal, the feedback signal, or both. Typically, the limiting is accomplished by utilizing diode clippers. Such clippers are characterized by abrupt transitions into conduction, and thus do not allow smooth control of resonance. Because of this, higher order harmonics are frequently created which distort the audio signal and may also cause the resonant filter to lock onto one or more of these harmonics uncontrollably. Further, they are susceptible to non-symmetric clipping of the output signal, and have an undesirable signal variation with temperature.

BRIEF DESCRIPTION OF THE INVENTION

OBJECTS OF THE INVENTION

Accordingly, it is an object of the invention to provide an improved filter.

Further, it is an object of the invention to provide an improved filter having a wide dynamic range.

Another object of the invention is to provide an inexpensive filter that is characterized by a high signal to noise ratio.

Still another object of the invention is to provide an improved resonant filter capable of smooth transition into resonance.

Still another object of the invention is to provide a smooth filter limiter.

Yet another object of the invention is to provide a resonant filter capable of operating as a low distortion sine wave oscillator.

A further object of the invention is to provide a voltage controlled oscillating filter capable of passing an input signal without significant distortion while self oscillating.

SUMMARY OF THE INVENTION

In accordance with the invention, a voltage controlled filter characterized by a high signal to noise ratio, good linearity, and wide dynamic range is formed from a number of serially-connected filter stages, each stage including a current amplifier having an integrating capacitor connected in feedback relation around it, a bipolar differential pair transconductance input stage for driving the current amplifier, and resistive feedback from the amplifier output to the input stage to maintain the transconductance essentially constant. The current amplifiers advantageously are "Norton" amplifiers, such as model LM3900 units, which are characterized by their low noise, low cost, and ready availability. By utilizing such amplifiers, we have constructed a 4 pole filter having a signal noise ratio of the order of 60–70 db; this is in marked contrast to typical signal-to-noise ratios of 45 db for conventional "ladder type" RC filters, employing the base-to-emitter diode of a bipolar transistor as a variable resistance element.

The transconductance comprises a matched pair of bipolar transistors with their emitters connected to a common source of control current and their collectors connected to the inverting and non-inverting inputs, respectively, of the current amplifier. The signal inputs to the transconductance are applied to the transistor bases, together with a negative feedback signal from the output of the stage which maintains the net input signal from base-to-base of the transistors at a low value. This insures that the transconductance pair remains within the small signal operating region and operates with substantially constant transconductance, $g_m$.

The limiter in the input stage is formed from a similar matched pair of bipolar transistors whose emitters are also connected to the respective bases of the variable transconductance pair of the first filter stage. In contrast to the filter stage transconductances, the limiter transconductance is outside the feedback loop of the filter stage it drives and a substantial net input signal can be applied to it to vary its transconductance over a substantial range. This provides a smooth limiting of input signals applied thereto, which is especially important when the filter is used with positive feedback to provide controlled resonance, since it prevents locking the filter onto a particular harmonic as may sometimes occur with diode limiting; it thereby allows the filter to smoothly sweep across a wide frequency band in response to a varying control voltage. Further, it also enables utilization of the filter to simultaneously pass a signal input of arbitrary shape together with a self-generated low distortion sine wave with little intermodulation between the two, this provides interesting and pleasing musical sounds.

DETAILED DESCRIPTION OF THE INVENTION

Figures 1, 2:
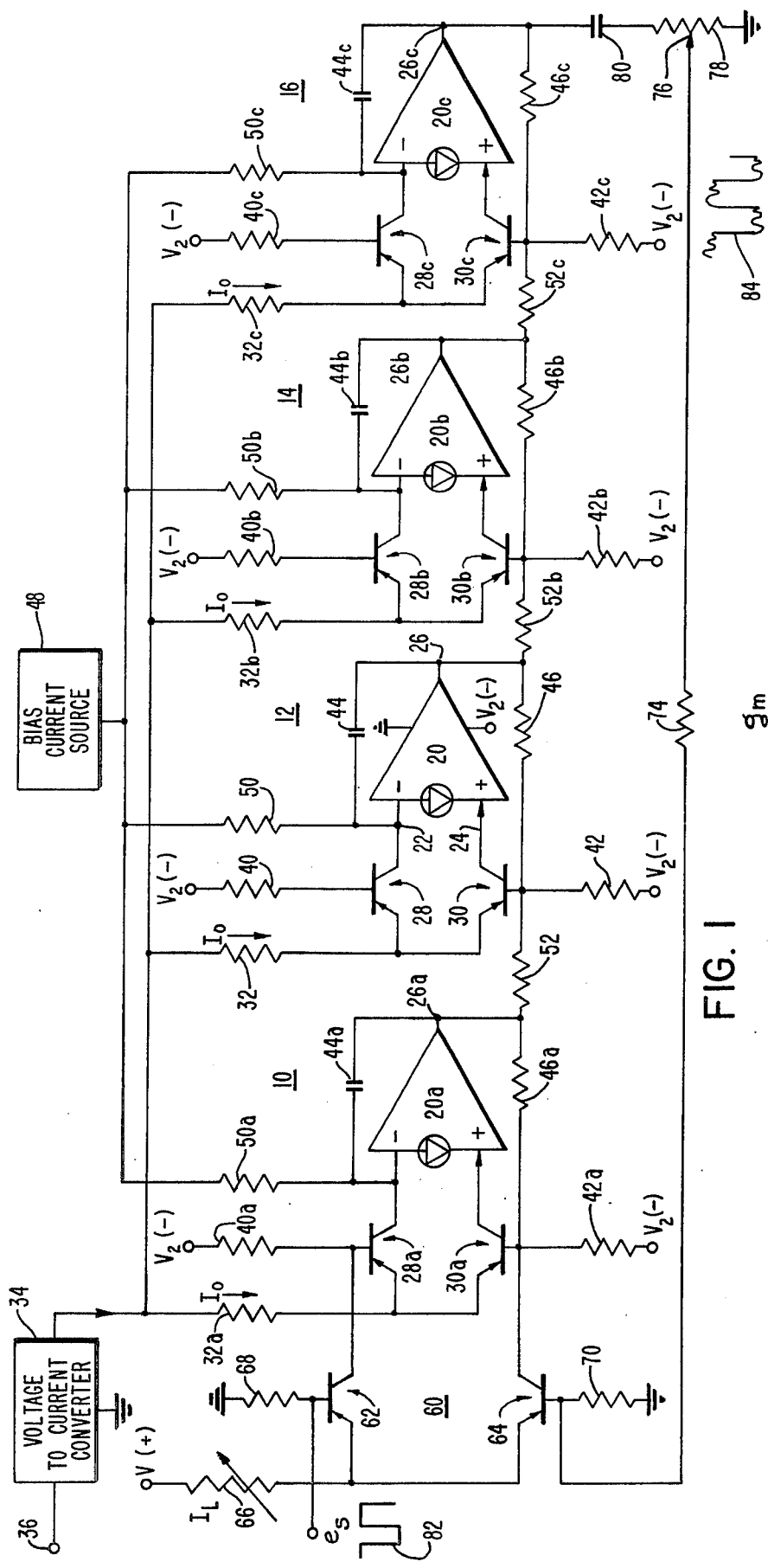

The foregoing and other and further objects and features of the invention will be more readily understood from the following detailed description of the invention, when taken in conjunction with the accompanying drawings, in which:

FIG. 1 is a block and line diagram of an improved filter in accordance with the present invention; and FIG. 2 is a sketch of the variation of the trans-conductance, $g_m$, with the base-to-base voltage across the transconductance pair.

In FIG. 1, a 4-pole low pass filter is formed from a number of filter stages, 10, 12, 14, and 16. Each stage is identical, and thus only one of the stage, stage 12, will be described in detail, the corresponding components of each of the other stages being designated by the same number together with an appended letter such as 20a, 20b, etc. As shown, each stage comprises a current amplifier having inverting and non-inverting input terminals 22 and 24, respectively, and an output terminal 26. A pair of symmetric transistors 28 and 30, respectively, serves as a symmetric transconductance at the input of the amplifier 20. The collectors of the transistors 28 and 30 are connected to the inverting and non-inverting inputs of the amplifier, respectively, while the emitters of these transistors are connected in common to a current dividing resistor 32 which is supplied with control current from a voltage-to-current converter 34. The magnitude of the current $I_0$ is related to the control voltage $V_c$ applied as an input to the converter 34 and, preferably, is an exponential function of that voltage.

The bases of the transistors 28 and 30 are connected to a source of negative potential, designated $V_2$ (−), by resistors 40 and 42. An integrating capacitor 44 is connected in feedback relation around the amplifier from output terminal 26 to inverting input terminal 22; a resistor 46 is connected in the feedback relation from the output terminal 26 to the base of the transistor 30. Bias current for the amplifier 20 is supplied from a bias current source 48 through a current dividing resistor 50 connected to the inverting input terminal 22 of the amplifier, and the amplifier is supplied with power from a source $V_2$ (−). The input to the stage 12 is taken from the output terminal 26a of the preceeding stage and is applied to the base of the transistor 30 through a coupling resistor 52; the output of stage 12 is taken from the amplifier output terminal 26 and applied as input to the following stage through a resistor 52b.

Feedback is provided within each stage by means of the resistors 42 and 46. Because an increase in the signal applied to the base 30 decreases the output of the terminal 26, resistor 46 provides negative feedback between those two points. The feedback signal subtracts from the input signal to produce a small net driving signal at the base of transistor 30. Resistors 46 and 52 are preferably made equal so that the input signal magnitude and output signal magnitude are of equal amplitude. Further, resistor 42 is preferably much smaller than resistor 46. Referring to FIG. 2 which shows the variation of the transconductance $g_m$ of the transistors 28 and 30 as a function of the voltage $\Delta V$ (measured in units of $m = g/kT$) from base-to-base of these transistors, the feedback through resistor 46 limits the effective voltage excursion $\Delta V$ to a small excursion about the original in FIG. 20 so that the transconductance $g_m$ remains essentially constant; typically, the excursion is much smaller than one unit (i.e. $\Delta V$ is much less than 26 millivolts).

The operation of each filter stage is as follows: Amplifier 20 is a current (Norton) amplifier and responds to current differences at its input terminals. Absent an input signal at the base of transistor 30, the bases of the transistors 28 and 30 are biased to the same quiescent potential and the net voltage difference across them is zero. Accordingly, the transistors 28 and 30 share the current $I_0$ equally between them and the same current is therefore applied to the amplifier inverting input terminal as is applied to the non-inverting input terminal. Under these conditions, the current available to drive the external circuitry at the input terminal 22 is ideally zero, and no net integrating current flows through the capacitor 44; the amplifier output at the terminal 26 is therefore at its quiescent level.

When, however, an input signal is applied to the base of the transistor 30, a net voltage appears from base to base of the transistors 28 and 30 and the control current $I_0$ is shared unequally between these transistors. The current unbalance is proportional to the voltage difference between the bases and is accumulated in the capacitor 44 to provide a net output at the terminal 26. This output is then applied to the following stage by the resistor 52b.

The current $I_0$ establishes the quiescent value of $g_m$ (value for which $\Delta V = 0$ in FIG. 2). By varying the magnitude of this current the gain-bandwidth product of the filter stage 12, and thus its cut-off frequency, may readily be controlled over a dynamic range of 1000:1. For R42 much less than R46, it can be shown that voltage transfer function of each stage is given by:

$$\frac{E_{out}}{E_{in}} = \frac{-R46}{R52} \cdot \frac{1}{1 + \frac{j\omega C}{g_m \frac{R42}{R46}}} = \frac{-R46}{R52} \cdot \frac{1}{1 + \frac{j2m\omega C}{I_o}\frac{R46}{R42}}$$

where $m = kt/g$, $k$ = Boltzman's constant, $T$ = temperature in degrees Kelvin, and $q$ is the electron charge, $m$ = 26 millivolts at room temperature.

This is the transfer function of a single pole low pass filter, with the cut-off frequency $\omega_c$ given by $$\omega_c = I_o (R42)/(2mC\ R46)$$

Typical values of the circuit elements are R42 = 220 ohms, R46 = R52 = 12,000 ohms, C = 0.0047 microfarad. Normally, the current Io is the same in each stage, so that the cut-off frequency of each stage is the same. This provides a rolloff rate of 24db/octave in the frequency response above the cut-off frequency when the stages are cascaded. Further, because of the inversion in each stage, the offset voltage of each stage is cancelled by the subsequent stage if the amplifiers 20, 20a, etc. have the same offset voltage as they do when they are provided on the same monolithic clip as is the case of the LM3900 amplifiers.

Turning now to the limiter stage 60, it comprises first and second bipolar PNP transistors 62 and 64, respectively, connected as a differential pair. The emitters of these transistors are connected in common through a variable resistor 66 is a positive supply voltage designated $V_1$ (+); the collectors of these transistors are connected to the respective bases of the transistors 28a and 30a. Resistors 68 and 60 connect the bases of the transistor 62 and 64, respectively, to ground potential. The input signal to be processed is applied to an input terminal 72 which is connected directly to the base of the transistor 62; a feedback signal is coupled to the base of the transistor 64 via a resistor 74, the wiper arm 76 of a potentiometer 78 which is connected directly to the output terminal 26c of the final filter stage, and a large (e.g. 22 $\mu$F) DC decoupling capacitor 80.

At frequencies well below cut-off, there is a net sign inversion between the base of transistor 70 and the output terminal 26c of the filter; thus, the feedback to transistor 64 is negative at these frequencies. At increasing frequencies, each stage contributes an increasing phase shift until, at the cut-off frequency, each stage contributes 45° phase shift, for a net shift of 180°. When added to the inversion between the base of transistor 70 and the output terminal 26c, a net 0° phase shift is obtained and thereafter the feedback becomes positive and the filter resonates.

The transistors 62 and 64 provide effective limiting action to the input signal and the feedback signal, particularly under resonance conditions. This is a result of the fact that the transconductance, $g_m$, of the transistor pair 62, 64 is a function of the base-to-base voltage across the pair as shown in FIG. 2. Unlike the transconductance pairs 28, 30, in which the net base-to-base signal applied to the pair is limited by feedback so that their transconductance $g_m$ is essentially constant, the drive to the bases of the transistors 62 and 64 may vary over a range $\Delta V$ of up to 4 ($g/KT$), causing $g_m$ to vary widely in corresponding fashion. Thus, strong driving signals are greatly attenuated, while weaker signals are less attenuated. This helps to maintain the subsequent stages in their linear operating region and prevent signal distortion. This is especially important when the wiper arm 76 is set to provide substantial feedback to thereby obtain a strong resonance. Further, the limiter 60 provides symmetric and smooth limiting about the input signal zero level, and thus the positive and negative excursions of the input are limited equally. Thus a square wave input 80 may be shaped to a symmetrically resonant output 82 as shown in FIG. 1.

It will be noted that the effective collector impedance for each transistor 62, 64 in the limiter is effectively the low, 220 ohms base to ground resistor 40a, 42a, respectively. This helps to maintain the transconductance input pair 28a, 30a in the small signal region and thus ensures linear operation. Linearity is further promoted by limiting the maximum emitter current drive $I_L$ to the transistors 62 and 64. We have found that a source voltage $V_1$ (+) of 15 volts and a variable resistor R68 of 56,000 ohms provides sufficient drive to the transistors 62 and 64 while preventing overload of the transistors 28a and 30a. The resultant linearity is especially important when the filter is used in the highly resonant or oscillatory mode (that is, with substantial positive feedback obtained by adjustment of wiper arm 76 to cause the circuit to self-oscillate) while simultaneously passing an arbitrary input signal. Under these conditions, the filter generates a low distortion sine wave at the resonant frequency and passes both this wave and the filtered input wave to the output terminal with very low distortion. This provides pleasing and interesting musical effects not obtainable with conventional filters.

From the foregoing it will seem that we have provided an improved dynamic filter. The filter is characterized by a wide dynamic range and cut-off frequency (of the order of 1000:1) and low noise and distortion. A simple bipolar transistor transconductance pair operated at substantially constant transconductance, together with a current type amplifier connected as an integrator with additional resistive feedback, forms a simple, yet effective, filter stage which is readily cascaded to form a multiple-pole filter with excellent dynamic characteristics. The utilization of an even number of inverting stages in the filter insures that any offset voltages will be non-additive, and will thus cancel. A smooth limiter formed from a further bipolar transistor transconductance pair but operated at a varying transconductance greatly enhances the usefulness of the filter, especially when used with positive feedback as a resonant filter, and allows a smooth sweep of frequencies as the cut-off frequency of the filter is changed in response to control signals applied to it.

It will be apparent that various changes may be made in the preferred embodiment without departing from the spirit or scope of the invention. Thus, the input to each stage may be applied to the transistor 28, 28a, etc. instead of to the transistor 30, 30a, etc. Various other changes may also be made and it should be understood that the foregoing description should be taken as illustrative only and not in a limiting sense, the scope of the invention being defined in detail in the claims.

Having described our invention, we claim:

1. A dynamic filter comprising
   A. a plurality of cascaded filter stages, each including
      1. a current amplifier having an inverting input terminal, a non-inverting input terminal, and an output terminal
      2. an integrating capacitor connected between the inverting terminal and the output terminal thereof,
      3. first and second matched bipolar transistors having their collectors connected to the inverting and non-inverting input terminals, respectively, and their emitters connected in common to a current source for supplying emitter current thereto, said transistors being connected to operate at substantially constant transconductance,
      4. first and second resistors coupling the bases of said first and second transistors, respectively, to a common potential,
      5. a feedback resistor connected between the output terminal and the base of one of said transistors,
      6. means applying a signal to be filtered to the base of one of said transistors.

2. A filter according to claim 1 in which the base terminals of said transistors are biased by said first and second resistor means and said potential to the same quiescent potential in the absence of an input signal.

3. A filter according to claim 1 in which said feedback resistor is of a value substantially larger than the magnitude of said second resistor.

4. A filter according to claim 1 which includes resistor means for coupling the output of one stage to the input of the following stage, the magnitude of said resistor means being equal to the magnitude of the feedback resistor.

5. A filter according to claim 1 in which said feedback resistor is connected to the base of said second transistor.

6. A filter according to claim 5 in which said signal is connected to the base of said second transistor.

7. A filter according to claim 1 including a limiter for at least one of said filter stages, said limiter comprising 1. third and fourth transistors having their collectors connected to the bases of said first and second transistors, respectively, of one of stages, and having their emitters connected in common to a current source for supplying emitter current to said transistors, and connected to operate over a widely variable range of transconductance in response to the base-to-base voltage applied thereto,
2. means coupling the base of each said transistor to a reference potential, and
3. means for applying at least a first input signal to be limited to the base of one of said third and fourth transistors.

8. A filter according to claim 7 in which the means coupling the bases of said third and fourth transistors to a reference potential comprises third and fourth resistors, respectively.

9. A filter according to claim 8 which includes means for applying a feedback signal from the output of the last stage of said cascaded filter stages to the base of said fourth limiter transistor.

10. A filter according to claim 7 which includes means for applying a feedback signal to the base of the other of said third and fourth transistors.

11. A filter according to claim 10 in which said feedback signal applying means provides positive feedback to said other transistor at a selected frequency within the operating frequency of said filter to thereby establish oscillation in said filter simultaneously with filtering of said input signal.

12. A filter according to claim 11 which includes four cascaded filter stages, each of the inverting type, whereby any voltage offsets said stages caused by active elements therein are cancelled in pairs.

13. A low-distortion dynamic filter, comprising
A. at least one filter stage having first and second input terminals for receiving driving signals thereat, and including a transconductance element variable in response to a control signal, an integrator, and feedback from the output of said integrator to said transconductance element, and
B. a limiter preceeding said filter stage and formed from:
1. first and second bipolar transistors having their collectors connected to said first and second input terminals, respectively, and their emitters connected in common to a constant current source for supplying emitter current thereto, said transistors being connected to operate at a widely variable transconductance,
2. means coupling the bases of said transistors to a common potential, and
3. means for applying a signal to be filtered to the base of one of said transistors, said transistor increasingly limiting the collector current responsive to said signal as the magnitude of said signal increases.

14. A filter according to claim 13 which includes means for applying a feedback signal from the output of said filter stage to the base of the other of said transistors, the net base-to-base voltage established by said input signal and said feedback signal varying the transconductance of said limiter over a substantial range as the signal increases from minimum to maximum.

* * * * *